(12) United States Patent
Aoki

(10) Patent No.: US 8,274,329 B2
(45) Date of Patent: Sep. 25, 2012

(54) SIGNAL COMPENSATION DEVICE AND COMMUNICATION APPARATUS

(75) Inventor: Nobuhisa Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 94 days.

(21) Appl. No.: 13/015,428

(22) Filed: Jan. 27, 2011

(65) Prior Publication Data

US 2011/0181355 A1   Jul. 28, 2011

(30) Foreign Application Priority Data

Jan. 28, 2010   (JP) .................................. 2010-16577

(51) Int. Cl.
H03F 1/26 (2006.01)
H04L 25/49 (2006.01)
H04B 1/04 (2006.01)
(52) U.S. Cl. ...... 330/149; 375/296; 375/297; 455/114.3
(58) Field of Classification Search .................. 330/149; 375/296, 297; 455/114.3
See application file for complete search history.

(56) References Cited

U.S. PATENT DOCUMENTS 7,433,420 B1 * 10/2008 Dakshinamurthy et al. .. 375/296

FOREIGN PATENT DOCUMENTS

JP       2006-279775 A    10/2006

* cited by examiner

*Primary Examiner* — Robert Pascal
*Assistant Examiner* — Khiem Nguyen
(74) *Attorney, Agent, or Firm* — Fujitsu Patent Center

(57) ABSTRACT

A signal-compensation device includes a band-limitation unit that performs band limitation on a signal based on a variably adjusted band-set value and externally transmits the signal subjected to the band limitation to an amplifier, a measurement unit that measures a signal level of each of first and second signal components of a feedback signal which is part of an output of the amplifier fed back by a feedback unit to the band-limitation unit, where the each of first and second signal components is based on at least one of a property of variability of the band-set value, a feedback of the feedback signal by the feedback unit, and a nonlinear distortion of the amplifier, and an adjustment unit that adjusts the band-set value based on the signal level of each of the first and second signal components.

20 Claims, 7 Drawing Sheets

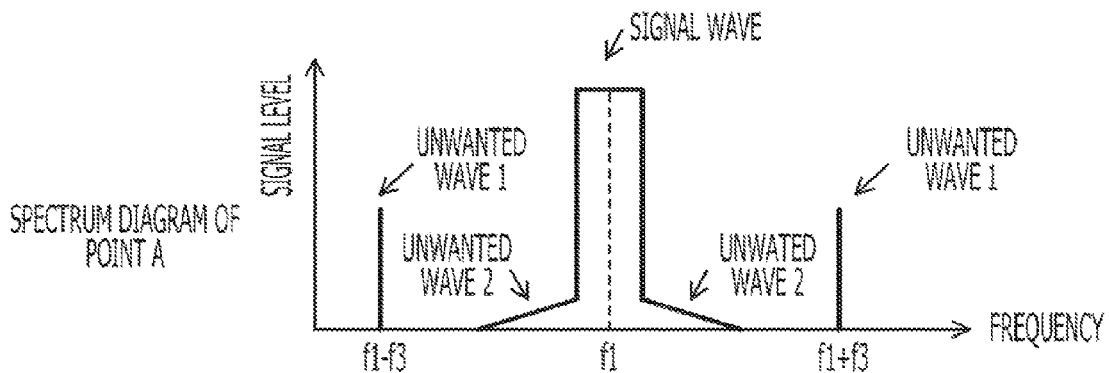
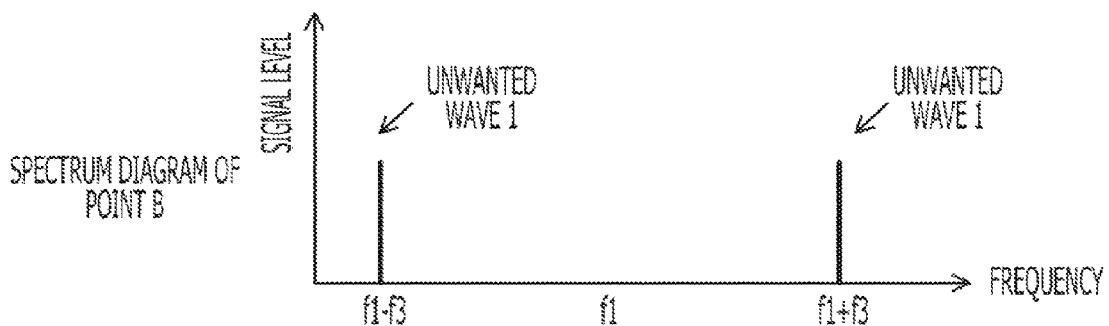
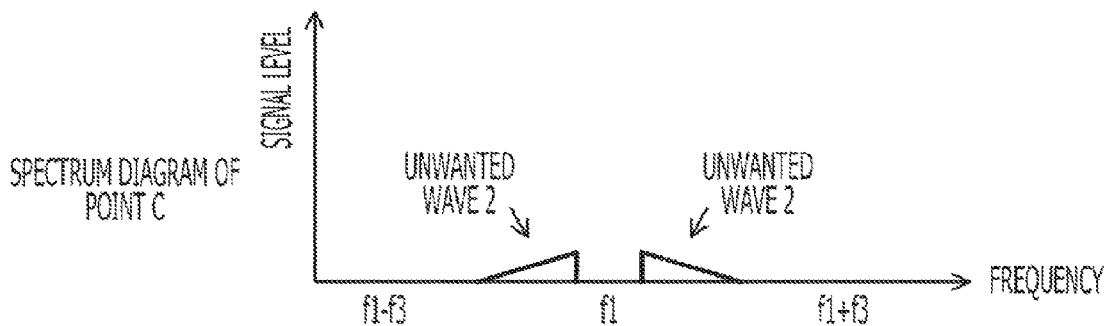

SIGNAL COMPENSATION DEVICE AND COMMUNICATION APPARATUS

CROSS-REFERENCE TO RELATED APPLICATION

This application is based upon and claims the benefit of priority of the prior Japanese Patent Application No. 2010-016577, filed on Jan. 28, 2010, the entire contents of which are incorporated herein by reference.

FIELD

Embodiments discussed herein relate to a signal-compensation device configured to compensate for a signal waveform achieved through an amplifier and a communication apparatus including the signal-compensation device.

BACKGROUND

For amplifiers including, for example, a power amplifier used for a communication apparatus including a mobile phone, a radio-base station, and so forth, the linearity has been demanded to amplify an input signal (e.g., a transmission signal) with low distortion. For achieving the linearity of an amplifier, remedies for compensating for a nonlinear distortion (nonlinear-waveform distortion) occurring in the amplifier have been performed. As an example, a negative-feedback system has been available as an exemplary nonlinear-distortion compensation system.

It has been recognized that a delay occurs in a negative-feedback loop due to the substrate wiring, a circuit component for use, the circuit configuration, and so forth when compensating for the nonlinear distortion through the use of the negative-feedback system. The above-described delay causes a phase shift in the negative-feedback loop, the phase shift corresponding to the frequency of the input signal. It is assumed that a signal component with a phase shift of 180° or more is negatively fed back to the input of the amplifier at that time. However, the negative feedback of the signal component with a phase shift of 180° or more actually becomes a positive feedback for the input signal, which is undesirable because the positive feedback for the input signal causes the amplifier to oscillate. Therefore, a filter provided to set the gain of the signal component with a phase shift of 180° or more to 0 dB or less may be provided in the negative-feedback loop considering the delay in the negative-feedback loop.

Hitherto, the design of the filter provided in the negative-feedback loop (e.g., the design of the band of the filter) has been performed through a maker manufacturing the filter and/or an amplifier including the filter by following the steps below. First, the property of the negative-feedback loop including no filter is measured. After that, the band of the filter is adjusted as desired to set the gain of a signal component having a phase sift of 180° or more, which occurs in the negative-feedback loop, to 0 dB or less by providing the filter in the negative-feedback loop. Thus, the filter design is performed.

SUMMARY

According to an aspect of the embodiments discussed herein, a signal-compensation device includes a band-limitation unit that performs band limitation on a signal based on a variably adjusted band-set value and externally transmits the signal subjected to the band limitation to an amplifier, a measurement unit that measures a signal level of each of first and second signal components of a feedback signal which is part of an output of the amplifier fed back by a feedback unit to the band-limitation unit, where the each of first and second signal components is based on at least one of a property of variability of the band-set value, a feedback of the feedback signal by the feedback unit, and a nonlinear distortion of the amplifier, and an adjustment unit that adjusts the band-set value based on the signal level of each of the first and second signal components.

The object and advantages of the embodiments will be realized and attained by at least the elements, features, and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 2A is a waveform diagram illustrating the waveform of a signal observed in a specific circuit part of the amplifier of the first embodiment;

FIG. 2B is a waveform diagram illustrating the waveform of another signal observed in the specific circuit part of the amplifier of the first embodiment;

FIG. 2C is a waveform diagram illustrating the waveform of another signal observed in the specific circuit part of the amplifier of the first embodiment;

DESCRIPTION OF EMBODIMENTS

Hereinafter, an amplifier according to one or more embodiments will be described with reference to the attached drawings as exemplary embodiments relating to technologies that are disclosed in this specification. Hereinafter, an amplifier including a modulator performing quadrature-modulation processing will be described as an exemplary amplifier. The above-described amplifier may be used in, for example, a communication apparatus including a mobile phone, a radio-base station, and so forth.

Here, in recent years, the component supply has often been provided in chips for the communication apparatuses. For example, a maker manufacturing the communication apparatus individually obtains a chip including a power amplifier, a chip including an analog circuit other than the power amplifier, and/or a different chip, and combines the above-described chips together, so that a communication apparatus including the above-described amplifier compensating for the nonlinear distortion through the use of the negative-feedback system is manufactured. However, the delay in the negative-feedback loop is changed due to the property of the power amplifier, the substrate wiring, and so forth. Therefore, the maker manufacturing the communication apparatus may be requested to have the expertise to design the above-described filter provided in the negative-feedback loop. However, the maker may have no staff having the above-described expertise. Therefore, there has been a technical problem, that is, the difficulty of manufacturing the amplifier appropriately.

Further, it is assumed that the filter may be designed without much consideration of the band in the case where the input signal has a small bandwidth. However, according to communication systems that had been used in recent years, including the code division multiple access (CDMA) system, the long term evolution (LTE) system, etc., the bandwidth of the input signal has been increased. In that case, the frequency of the signal component caused by the delay in the negative-feedback loop and that of the input signal may approach each other. Therefore, when the band of the filter is designed only for cutting the signal component caused by the delay in the negative-feedback loop, the designed filter band (the cut-off frequency of the filter) may enter the band of the input signal. In that case, it may become difficult to sufficiently compensate for the nonlinear distortion while cutting the signal component caused by the delay in the negative-feedback loop. As a result, the maker may be requested to have the expertise to design the filter.

First Embodiment

Figure 1:
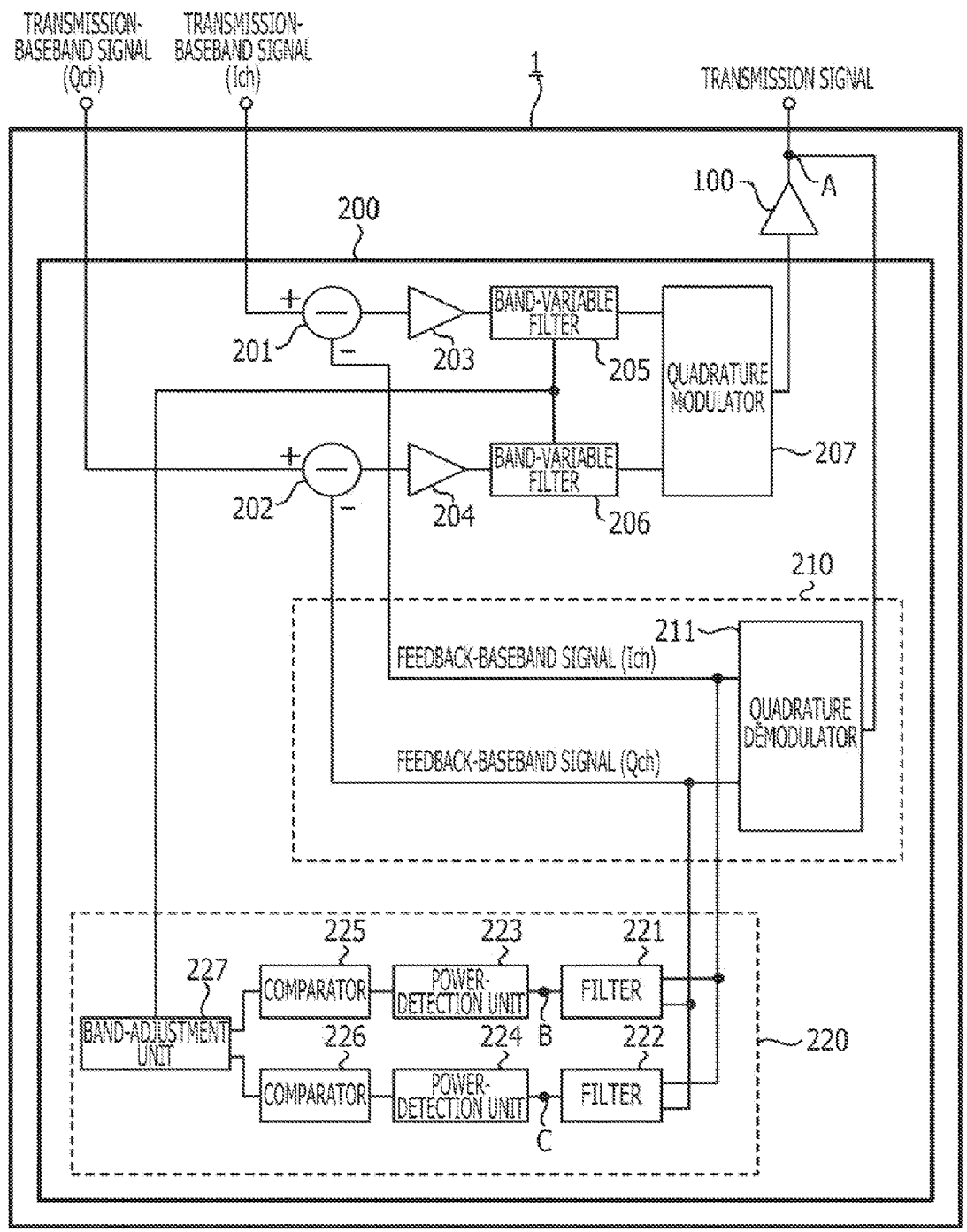
FIG. 1 is a block diagram illustrating an exemplary configuration of an amplifier according to a first embodiment.
Figure 3A:
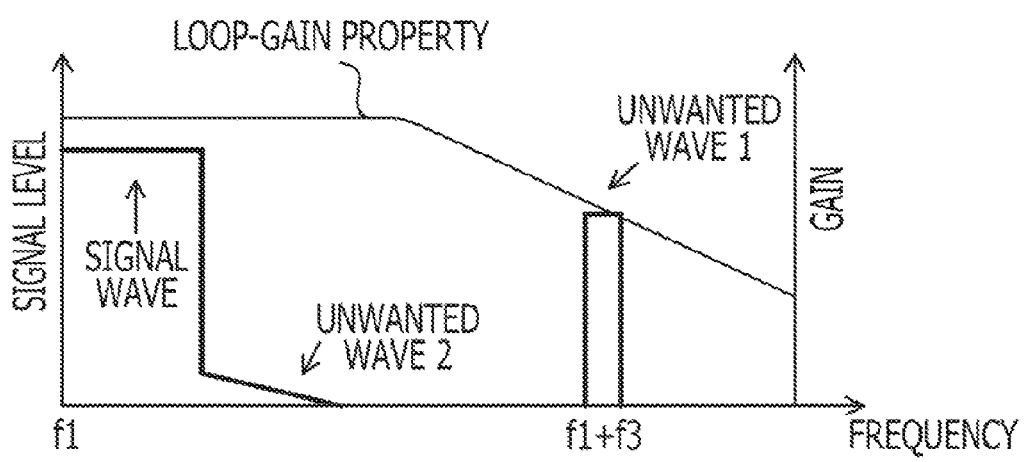
FIG. 3A is a waveform diagram illustrating a signal waveform observed when the band of each of band-variable filters that are provided in the amplifier of the first embodiment is adjusted.
Figure 3B:
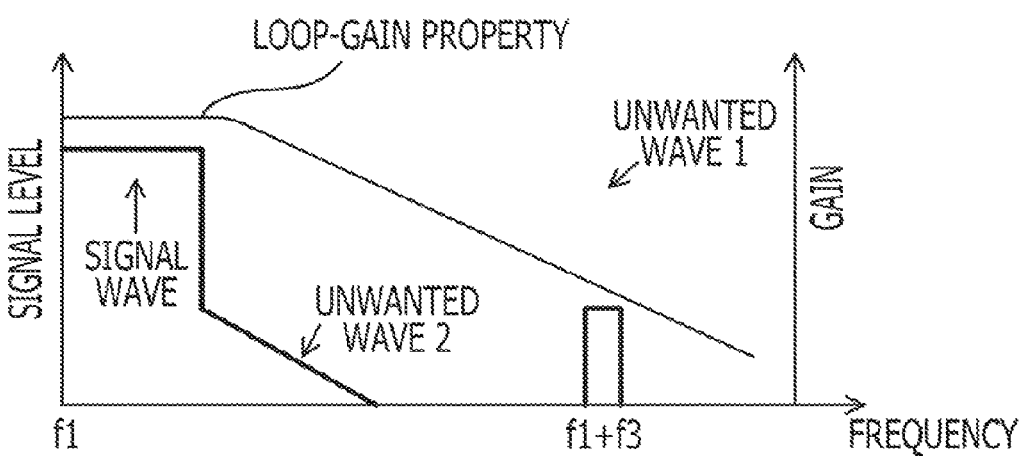
FIG. 3B is a waveform diagram illustrating another signal waveform observed when the band of each of the band-variable filters that are provided in the amplifier of the first embodiment is adjusted.

An amplifier 1 according to a first embodiment will be descried with reference to FIGS. 1, 2A, 2B, 2C, 3A, and 3B. Here, FIG. 1 is a block diagram illustrating an exemplary configuration of the amplifier 1. Each of FIGS. 2A to 2C is a waveform diagram illustrating the waveform of a signal observed in a specific circuit part of the amplifier 1 of the first embodiment, and each of FIGS. 3A and 3B is a waveform diagram illustrating a signal waveform observed when the band of each of band-variable filters 205 and 206 that are provided in the amplifier 1 is adjusted.

As illustrated in FIG. 1, the amplifier 1 of the first embodiment includes a power amplifier 100 provided as an embodiment of an amplifier and a distortion-compensation circuit 200 provided as an embodiment of a signal-compensation device. The signal-compensation circuit 200 includes subtractors 201 and 202, loop-gain amplifiers 203 and 204, band-variable filters 205 and 206, each of which is provided as an embodiment of a band-limitation unit, a quadrature modulator 207, a feedback circuit 210 provided as an embodiment of a feedback unit, and a band-adjustment circuit 220. The feedback circuit 210 includes a quadrature demodulator 211. The band-adjustment circuit 220 includes filters 221 and 222, power-detection units 223 and 224, each of which is provided as an embodiment of a measurement unit, comparators 225 and 226, and a band-adjustment unit 227 provided as an embodiment of an adjustment unit. The above-described amplifier 1 operates as below.

Each of a transmission-baseband signal (Ich: in-phase component) provided as an input signal and a feedback-baseband signal (Ich) fed back from the feedback circuit 210 is transmitted to the subtractor 201. The subtractor 201 externally transmits a baseband signal (Ich) obtained by subtracting the feedback-baseband signal (Ich) from the transmission-baseband signal (Ich) to the loop-gain amplifier 203.

Each of a transmission-baseband signal (Qch: out-of-phase component) provided as an input signal and a feedback-baseband signal (Qch) fed back from the feedback circuit 210 is transmitted to the subtractor 202. The subtractor 202 externally transmits a baseband signal (Qch) obtained by subtracting the feedback-baseband signal (Qch) from the transmission-baseband signal (Qch) to the loop-gain amplifier 204.

The loop-gain amplifier 203 performs amplification processing (and/or attenuation processing) for the baseband signal (Ich) which is externally transmitted from the subtractor 201 based on a given loop gain. The loop-gain amplifier 203 externally transmits the amplified baseband signal (Ich) to the band-variable filter 205.

The loop-gain amplifier 204 performs amplification processing (and/or attenuation processing) for the baseband signal (Ich) which is externally transmitted from the subtractor 202 based on a given loop gain. The loop-gain amplifier 204 externally transmits the amplified baseband signal (Qch) to the band-variable filter 206.

The band-variable filter 205 performs band-limitation processing for the baseband signal (Ich) which is externally transmitted from the loop-gain amplifier 203 based on a band-set value (e.g., a cut-off-frequency set value) set through the band-adjustment circuit 220. The band-variable filter 205 externally transmits the baseband signal (Ich) subjected to the band-limitation processing to the quadrature modulator 207.

The band-variable filter 206 performs the band-limitation processing for the baseband signal (Ich) which is externally transmitted from the loop-gain amplifier 204 based on the band-set value (e.g., the cut-off-frequency set value) set through the band-adjustment circuit 220. The band-variable filter 206 externally transmits the baseband signal (Qch) subjected to the band-limitation processing to the quadrature modulator 207.

The quadrature modulator 207 performs quadrature-modulation processing for the baseband signal (Ich) which is externally transmitted from the band-variable filter 205 and the baseband signal (Qch) which is externally transmitted from the band-variable filter 206. Consequently, the quadrature modulator 207 may generate a transmission signal. The quadrature modulator 207 externally transmits the generated transmission signal to the power amplifier 100.

The power amplifier 100 performs the amplification processing (and/or the attenuation processing) for the transmission signal based on a given transmission gain. The power amplifier 100 externally transmits the amplified transmission signal to an antenna, for example.

Here, the transmission signal (that is, a transmission signal observed at a point A illustrated in FIG. 1) which is externally transmitted from the power amplifier 100 will be described with reference to FIG. 2A. The transmission signal which is externally transmitted from the power amplifier 100 includes (i) a signal wave near a frequency f1, which corresponds to the transmission-baseband signal (Ich) and the transmission-baseband signal (Qch), (ii) an unwanted wave 1 near a frequency f1±f3, which occurs due to a delay in a feedback loop that starts from the subtractors 201 and 202, and that returns to the subtractors 201 and 202 via the feedback circuit 210, and (iii) an unwanted wave 2 occurring in the base of a signal wave due to a nonlinear distortion occurring in the power amplifier 100.

Each of the unwanted waves 1 and 2 has the following properties. First, the unwanted wave 1 has the property of decreasing the signal level with a decrease in the band-set value (that is, a decrease in the band) of each of the band-variable filters 205 and 206. On the other hand, the unwanted wave 2 has the property of increasing the signal level with a decrease in the band-set value (that is, a decrease in the band)

of each of the band-variable filters 205 and 206. The above-described properties will be specifically described with reference to FIGS. 3A and 3B.

FIG. 3A illustrates the frequency property of a gain (loop gain) obtained in a feedback loop that starts from the subtractors 201 and 203, and that returns to the subtractors 201 and 202 via the feedback circuit 210, and the signal level of each of the signal wave, and the unwanted waves 1 and 2, where the frequency property and the signal levels are obtained before the band-set value of each of the band-variable filters 205 and 206 is adjusted. The state illustrated in FIG. 3A is determined to be an initial state and the band-set value of each of the band-variable filters 205 and 206 is decreased so that the loop-gain property is changed as illustrated in FIG. 3B. According to the example illustrated in FIG. 3B, the loop-gain property obtained after the band-set value is adjusted is changed so that the cut-off frequency is decreased in comparison with that obtained before the band-set value is adjusted. Therefore, the signal level of the unwanted wave 1 is decreased due to a decrease in a gain obtained near a frequency f1+f3. On the other hand, the effect of suppressing the nonlinear distortion is decreased due to a decrease in a gain obtained near a frequency f1. As a result, the signal level of the unwanted wave 2 occurring in the base of the signal wave is increased. Thus, the unwanted waves 1 and 2 have the properties of changing the signal levels so that the signal levels cancel each other in relation to the adjustment amount of the band-set value of each of the band-variable filters 205 and 206.

It is preferable that the unwanted waves 1 and 2 be attenuated and/or eliminated to increase the signal property. In the amplifier 1 of the first embodiment, (i) the transmission signal is negatively fed back to the transmission-baseband signal as the feedback-baseband signal, and (ii) the band-set value of each of the band-variable filters 205 and 206 is adjusted under the control of the band-adjustment circuit 220, so as to attenuate and/or eliminate the unwanted waves 1 and 2. Consequently, the entire and/or part of the transmission signals that are externally transmitted from the power amplifier 100 are externally transmitted to the feedback circuit 210.

The quadrature demodulator 211 provided in the feedback circuit 210 performs quadrature-demodulation processing for the transmission signal which is externally transmitted from the power amplifier 100. Consequently, the quadrature demodulator 211 may generate the feedback-baseband signal (Ich) and the feedback-baseband signal (Qch). The quadrature demodulator 211 externally transmits the generated feedback-baseband signal (Ich) to the subtractor 201 so that the feedback-baseband signal (Ich) is fed back to the subtractor 201. Additionally, the quadrature demodulator 211 externally transmits the generated feedback-baseband signal (Qch) to the subtractor 202 so that the feedback-baseband signal (Qch) is fed back to the subtractor 202.

Further, the quadrature demodulator 211 externally transmits the generated feedback-baseband signals (Ich and Qch) to each of the filters 221 and 222 that are provided in the band-adjustment circuit 220.

The filter 221 performs filtering processing for each of the feedback-baseband signals (Ich and Qch), so as to allow the unwanted wave 1 to pass through while interrupting the signal wave and the unwanted wave 2. After that, the filter 221 externally transmits the baseband signal subjected to the filtering processing to the power-detection unit 223. At that time, the baseband signal which is externally transmitted from the filter 221 (that is, a baseband signal observed at a point B illustrated in FIG. 1) includes the unwanted wave 1, and hardly includes and/or does not include the signal wave and the unwanted wave 2 as illustrated in a spectrum diagram of FIG. 2B.

The filter 222 performs the filtering processing for each of the feedback-baseband signals (Ich and Qch), so as to allow the unwanted wave 2 to pass through while interrupting the signal wave and the unwanted wave 1. After that, the filter 222 externally transmits the baseband signal subjected to the filtering processing to the power-detection unit 224. At that time, the baseband signal which is externally transmitted from the filter 222 (that is, a baseband signal observed at a point C illustrated in FIG. 1) includes the unwanted wave 2, and hardly includes and/or does not include the signal wave and the unwanted wave 1 as illustrated in a spectrum diagram of FIG. 2C.

The power-detection unit 223 detects the signal level (power value) of a baseband signal (that is, the baseband signal including the unwanted wave 1) which is externally transmitted from the filter 221. As a result, the power-detection unit 223 detects the signal level of the unwanted wave 1. After that, the power-detection unit 223 externally transmits data of the detected signal level of the unwanted wave 1 to the comparator 225.

The power-detection unit 224 detects the signal level (power value) of a baseband signal (that is, the baseband signal including the unwanted wave 2) which is externally transmitted from the filter 222. As a result, the power-detection unit 224 detects the signal level of the unwanted wave 2. After that, the power-detection unit 224 externally transmits data of the detected signal level of the unwanted wave 2 to the comparator 226.

The comparator 225 compares the signal level of the unwanted wave 1 to a first given threshold value. It is preferable that the maximum signal-level value of the unwanted wave 1 be determined to be the first threshold value, where the maximum signal-level value is determined based on the specifications of the amplifier 1 (and/or a communication apparatus including the amplifier 1). The comparator 225 externally transmits data of a result of the comparison (e.g., the magnitude relation) between the signal level of the unwanted wave 1 and the first given threshold value to the band-adjustment unit 227.

The comparator 226 compares the signal level of the unwanted wave 2 to a second given threshold value. It is preferable that the maximum signal-level value of the unwanted wave 2 be determined to be the second threshold value, where the maximum signal-level value is determined based on the specifications of the amplifier 1 (and/or a communication apparatus including the amplifier 1). The comparator 226 externally transmits data of a result of the comparison (e.g., the magnitude relation) between the signal level of the unwanted wave 2 and the second given threshold value to the band-adjustment unit 227.

The band-adjustment unit 227 adjusts the band-set value of each of the band-variable filters 205 and 206 based on the comparison results that are obtained through the comparators 225 and 226. For example, when the signal level of the unwanted wave 1 is larger than the first threshold value and/or that of the unwanted wave 2 is larger than the second threshold value, the band-adjustment unit 227 adjusts the band-set value of each of the band-variable filters 205 and 206 so that the signal level of the unwanted wave 1 becomes smaller than the first threshold value and that of the unwanted wave 2 becomes smaller than the second threshold value. On the other hand, when the signal level of the unwanted wave 1 is smaller than the first threshold value and that of the unwanted wave 2 is smaller than the second threshold value, for example, the band-adjustment unit 227 may not adjust the band-set value of each of the band-variable filters 205 and 206.

Here, the band-adjustment unit 227 may adjust the band-set value of each of the band-variable filters 205 and 206 through the following procedures considering the above-described properties of the unwanted waves 1 and 2 (more specifically, the unwanted waves 1 and 2 have the properties of changing the signal levels so that the signal levels cancel each other in relation to the adjustment amount of the band-set value of each of the band-variable filters 205 and 206). First, the band-adjustment unit 227 maximizes the band-set value of each of the band-variable filters 205 and 206, and confirms whether or not the signal level of the unwanted wave 2 is smaller than the second threshold value. After that, the band-adjustment unit 227 gradually decreases the band-set value of each of the band-variable filters 205 and 206 while confirming that the state where the signal level of the unwanted wave 2 is smaller than the second threshold value is maintained, so as to find the point where the signal level of the unwanted wave 1 becomes smaller than the first threshold value. After that, the band-adjustment unit 227 terminates the adjustment of the band-set value of each of the band-variable filters 205 and 206 when the signal level of the unwanted wave 1 becomes smaller than the first threshold value. Consequently, the band-adjustment unit 227 may adjust the band-set value of each of the band-variable filters 205 and 206 so that the signal levels of the unwanted waves 1 and 2 become smaller than the first and second threshold values.

As described above, the amplifier of the first embodiment allows for decreasing the signal level of each of the unwanted wave 1 caused by the delay occurring in the feedback loop and the unwanted wave 2 caused by the nonlinear distortion occurring in the power amplifier 100.

Additionally, the amplifier 1 of the first embodiments allows for performing the adjustment of the band-set value, in a sense, automatically and/or autonomously through operations of the band-adjustment unit 227, so as to decrease the signal level of each of the unwanted waves 1 and 2. Therefore, the amplifier 1 which allows for decreasing the signal level of each of the unwanted waves 1 and 2 may be achieved without having the expertise to perform the adjustment of the band-set value (that is, the design of the band-variable filters 205 and 206). In other words, the amplifier 1 decreasing the signal level of each of the unwanted waves 1 and 2 may be achieved without manually adjusting the band-set value (that is, designing the band-variable filters 205 and 206). Therefore, even though the amplifier 1 (and/or a communication apparatus including the amplifier 1, which will be described later) is manufactured by individually obtaining a chip including the band-variable filters 205 and 206 (e.g., the above-described signal-compensation circuit 200) and a chip including the power amplifier 100, and combining the chips with each other, the achieved amplifier 1 (and/or a communication apparatus including the amplifier 1, which will be described later) may decrease the signal level of each of the unwanted waves 1 and 2.

The above-described first embodiment illustrates the amplifier 1 including the modulator performing the quadrature modulation. However, an amplifier including a modulator performing modulation processing other than the quadrature modulation may be used. Further, the sequence of input signals that are transmitted to the amplifier may not be limited to "two systems" that are illustrated in the first embodiment in accordance with the modulation system. The amplifier configured in that manner may also achieve the above-described various effects. In addition, the amplifier may not include the modulator performing the modulation processing. For example, the above-described various effects may be enjoyed through an amplifier including a subtractor receiving an input signal and a feedback signal (e.g., the subtractor 201), a band-variable filter receiving a signal which is externally transmitted from the subtractor (e.g., the band-variable filter 205), a power amplifier receiving a signal which is externally transmitted from the band-variable filter (e.g., the power amplifier 100), a feedback circuit feeding back a signal which is externally transmitted from the power amplifier to the subtractor as a feedback signal (the feedback circuit 210 including no quadrature demodulator), and a band-adjustment circuit (e.g., the band-adjustment circuit 220 including either the filter 221 or the filter 222, either the power-detection unit 223 or the power-detection unit 224, either the comparator 225 or the comparator 226, and the band-adjustment unit 227), as is the case with second, third, and fourth embodiments that follow.

Second Embodiment

Figure 4:
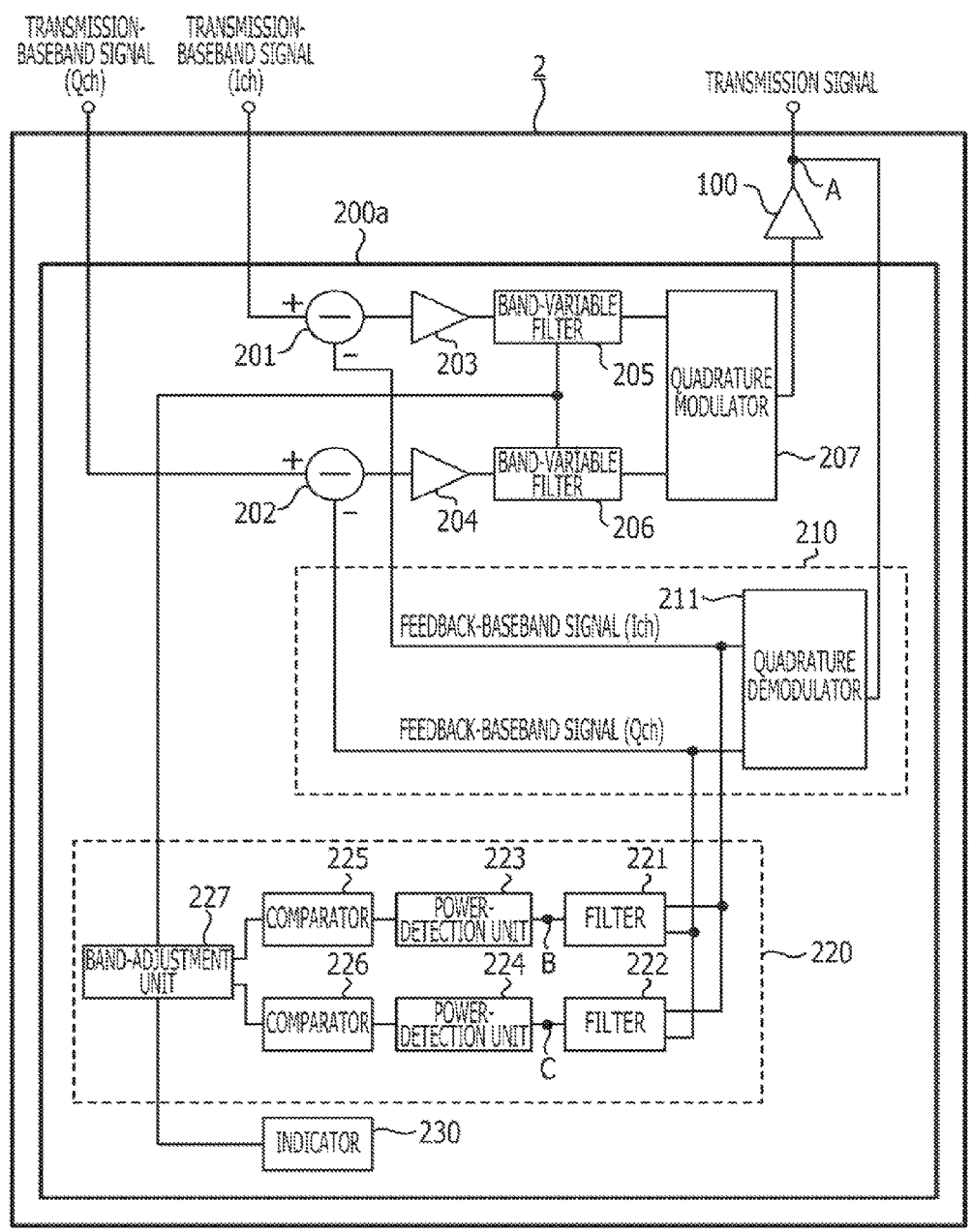
FIG. 4 is a block diagram illustrating an exemplary configuration of an amplifier according to a second embodiment.

An amplifier 2 according to the second embodiment will be described with reference to FIG. 4. FIG. 4 is a block diagram illustrating an exemplary configuration of the amplifier 2. The same configuration as that of the amplifier 1 of the first embodiment will be illustrated with the same reference numerals so that the detailed descriptions of the configuration are omitted.

As illustrated in FIG. 4, the amplifier 2 of the second embodiment includes the power amplifier 100 and a distortion-compensation circuit 200a, as is the case with the amplifier 1 of the first embodiment. The distortion-compensation circuit 200a includes the subtractors 201 and 202, the loop-gain amplifiers 203 and 204, the band-variable filters 205 and 206, the quadrature modulator 207, the feedback circuit 210, and the band-adjustment circuit 220, as is the case with the distortion-compensation circuit 200 of the first embodiment.

The distortion-compensation circuit 200a of the second embodiment further includes an indicator 230 provided as an embodiment of a notification unit. In the second embodiment, the band-adjustment unit 227 notifies the indicator 230 that it is "hard to adjust" when it is difficult to adjust the band-set value of each of the band-variable filters 205 and 206 so that the signal levels of the unwanted waves 1 and 2 become smaller than the individual first and second threshold values. For example, it may be difficult to adjust the band-set value when the first and second threshold values are too small compared to properties of the unwanted waves 1 and 2. Upon being notified that it is "hard to adjust", the indicator 230 notifies a manufacturer fabricating a communication apparatus or the like including the amplifier 2 (and/or the manufacturer of the amplifier 2, for example) that it is "hard to adjust". For example, the indicator 230 may externally transmit a "high (H)-level" control signal to an external large-scale-integrated (LSI) circuit or the like when being notified that it is "hard to adjust" and may externally transmit a "low (L)-level" control signal to the external LSI circuit or the like when not being notified that it is "hard to adjust" so that, for example, the manufacturer fabricating the communication apparatus including the amplifier 2 is notified that it is "hard to adjust". Otherwise, when the indicator 230 includes a blinking element or device such as a light emitting diode (LED), the indicator 230 may turn on the blinking element when being notified that it is "hard to adjust" so that, for example, the manufacturer fabricating the communication apparatus or the like including the amplifier 2 is notified that it is "hard to adjust". Otherwise, when the indicator 230 including a display element or device such as a display is notified that it is "hard to adjust", the indicator 230 may display a message indicating that it is "hard to adjust" on the display element so that, for example, the manufacturer fabricating the communication apparatus or the like including the amplifier 2 is notified that it is "hard to adjust". Otherwise, when the indicator 230 including a sound-output element or device such as a speaker is notified that it is "hard to adjust", the indicator 230 may output a warning sound from the sound-output element so that, for example, the manufacturer fabricating the communication apparatus or the like including the amplifier 2 is notified that it is "hard to adjust". Otherwise, the indicator 230 may notify the manufacturer of the amplifier 2 that it is "hard to adjust" in a different mode.

The above-described amplifier 2 of the second embodiment allows for enjoying substantially the same effects as the various effects that are enjoyed through the amplifier 1 of the first embodiment.

Further, when it is difficult to appropriately adjust the band-set value of each of the band-variable filters 205 and 206, the amplifier 2 of the second embodiment allows for notifying, for example, the manufacturer of the amplifier 2 that it is "hard to adjust". Therefore, the manufacturer of the amplifier 2 may recognize that it is difficult to obtain a desired property through the power amplifier 100 and the distortion-compensation circuit 200 that are going to be used in combination with relative ease.

Third Embodiment

Figure 5:
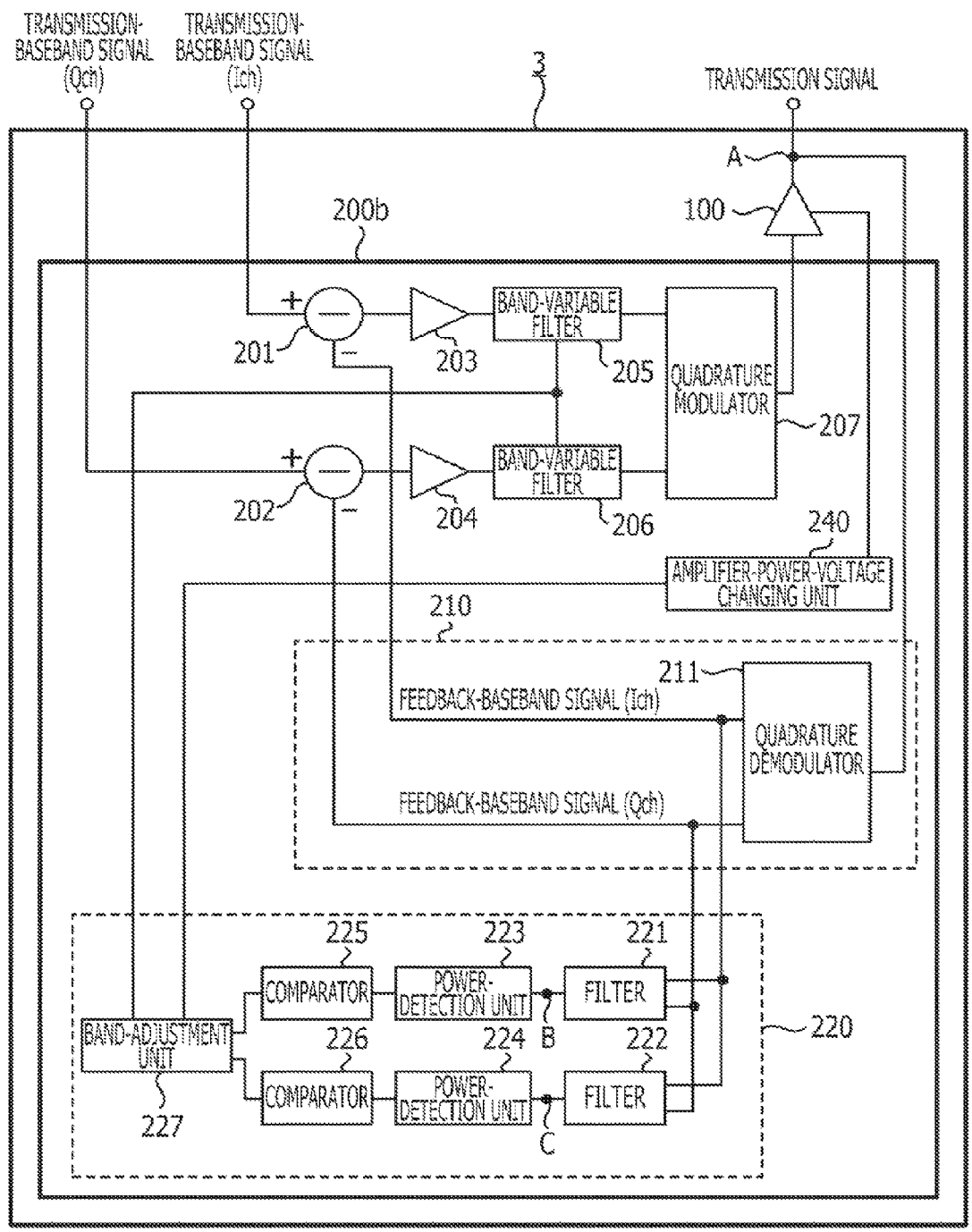
FIG. 5 is a block diagram illustrating an exemplary configuration of an amplifier according to a third embodiment.

Next, an amplifier 3 according to a third embodiment will be described with reference to FIG. 5. FIG. 5 is a block diagram illustrating an exemplary configuration of the amplifier 3. Substantially the same configuration as that of the amplifier 1 of the first embodiment will be illustrated with the same reference numerals so that the detailed descriptions of the configuration are omitted.

As illustrated in FIG. 5, the amplifier 3 of the third embodiment includes the power amplifier 100 and a distortion-compensation circuit 200b, as is the case with the amplifier 1 of the first embodiment. The distortion-compensation circuit 200b of the third embodiment includes the subtractors 201 and 202, the loop-gain amplifiers 203 and 204, the band-variable filters 205 and 206, the quadrature modulator 207, the feedback circuit 210, and the band-adjustment circuit 220, as is the case with the distortion-compensation circuit 200 of the first embodiment.

The distortion-compensation circuit 200b of the third embodiment further includes an amplifier-power-voltage changing unit 240. In the third embodiment, the band-adjustment unit 227 notifies the amplifier-power-voltage changing unit 240 that it is "hard to adjust" when it is difficult to adjust the band-set value of each of the band-variable filters 205 and 206 so that the signal levels of the unwanted waves 1 and 2 become smaller than the individual first and second threshold values. When being notified that it is "hard to adjust", the amplifier-power-voltage changing unit 240 changes the power voltage of the power amplifier 100. For example, it is preferable that the amplifier-power-voltage changing unit 240 increase the power voltage of the power amplifier 100 by as much as a given value Δv upon being notified that it is "hard to adjust".

In the state where the power voltage of the power amplifier 100 is changed, the band-adjustment unit 227 readjusts the band-set value of each of the band-variable filters 205 and 206 so that the signal levels of the unwanted waves 1 and 2 become smaller than the individual first and second threshold values. If it is difficult to adjust each of the band-set values through the above-described readjustment, the band-adjustment unit 227 notifies the amplifier-power-voltage changing unit 240 that it is "hard to adjust" again. Upon being notified that it is "hard to adjust", the amplifier-power-voltage changing unit 240 changes the power voltage of the power amplifier 100 again. For example, it is preferable that the amplifier-power-voltage changing unit 240 further increase the power voltage of the power amplifier 100 by as much as the given value Δv upon being notified that it is "hard to adjust". That is, it is preferable that the amplifier-power-voltage changing unit 240 increase the power voltage of the power amplifier 100 by as much as the given value Δv for each notification that it is "hard to adjust". From then on, the above-described operations are repeated until the band-set value of each of the band-variable filters 205 and 206 is adjusted so that the signal levels of the unwanted waves 1 and 2 become smaller than the individual first and second threshold values.

The above-described amplifier 3 of the third embodiment allows for enjoying substantially the same effects as the various effects that are enjoyed through the amplifier 1 of the first embodiment.

Further, when it is difficult to appropriately adjust the band-set value of each of the band-variable filters 205 and 206, the amplifier 3 of the third embodiment may try to appropriately adjust each of the band-set values by changing the power voltage of the power amplifier 100. Therefore, the amplifier 3 allows for increasing the probability of achieving an appropriate adjustment of the band-set value in comparison with the amplifier configured not to change the power voltage of the power amplifier 100.

Fourth Embodiment

Figure 6:
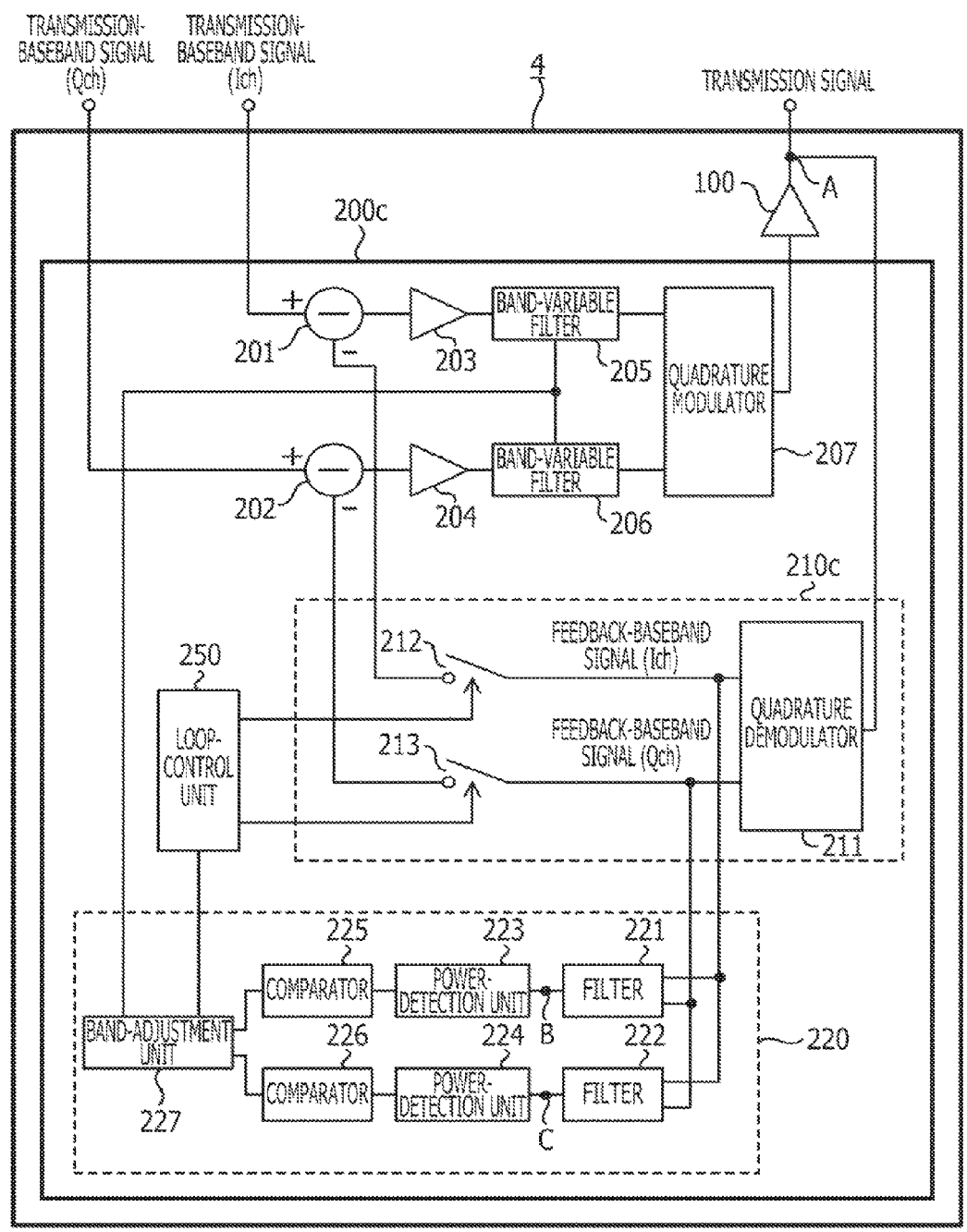
FIG. 6 is a block diagram illustrating an exemplary configuration of an amplifier according to a fourth embodiment.

An amplifier 4 according to a fourth embodiment will be described with reference to FIG. 6. FIG. 6 is a block diagram illustrating an exemplary configuration of the amplifier 4. Substantially the same configuration as that of the amplifier 1 of the first embodiment will be illustrated with the same reference numerals so that the detailed descriptions of the configuration are omitted.

As illustrated in FIG. 6, the amplifier 4 of the fourth embodiment includes the power amplifier 100 and a distortion-compensation circuit 200c, as is the case with the amplifier 1 of the first embodiment. The distortion-compensation circuit 200c of the fourth embodiment includes the subtractors 201 and 202, the loop-gain amplifiers 203 and 204, the band-variable filters 205 and 206, the quadrature modulator 207, a feedback circuit 210c, and the band-adjustment circuit 220, as is the case with the distortion-compensation circuit 200 of the first embodiment. The feedback circuit 210c of the fourth embodiment includes the quadrature demodulator 211, as is the case with the feedback circuit 210 of the first embodiment.

The feedback circuit 210c of the fourth embodiment further includes a switch 212 provided on a signal path extending from the quadrature demodulator 211 to the subtractor 201 and a switch 213 provided on a signal path extending from the quadrature demodulator 211 to the subtractor 202. Further, the distortion-compensation circuit 200c of the fourth embodiment further includes a loop-control unit 250 provided as an embodiment of a controller.

In the fourth embodiment, the band-adjustment unit 227 notifies the loop-control unit 250 that it is "hard to adjust" when it is difficult to adjust the band-set value of each of the band-variable filters 205 and 206 so that the signal levels of the unwanted waves 1 and 2 become smaller than the individual first and second threshold values. When being notified that it is "hard to adjust", the loop-control unit 250 controls the state of each of the switches 212 and 213 so that each of the switches 212 and 214 enters the open state (that is, the off state and/or the turn-off state). On the other hand, when not being notified that it is "hard to adjust", the loop-control unit 250 controls the state of each of the switches 212 and 213 so that each of the switches 212 and 213 enters the closed state (that is, the on state and/or the conduction state). That is, in the fourth embodiment, the feedback loop generated through the feedback circuit 210c stops operating when it is difficult to adjust the band-set value of each of the band-variable filters 205 and 206 so that the signal levels of the unwanted waves 1 and 2 become smaller than the individual first and second threshold values. In other words, the feedback loop generated through the feedback circuit 210c is selectively operated when the band-set value of each of the band-variable filters 205 and 205 may be adjusted so that the signal levels of the unwanted waves 1 and 2 become smaller than the individual first and second threshold values.

The above-described amplifier 4 of the fourth embodiment allows for enjoying substantially the same effects as the various effects that are enjoyed through the amplifier 1 of the first embodiment.

Further, when it is difficult to appropriately adjust the band-set value of each of the band-variable filters 205 and 206, the amplifier 4 of the fourth embodiment allows for electrically cutting the feedback loop generated through the feedback circuit 210c. Therefore, even though an inconvenience may occur due to the continuous operation of the feedback loop, the continuous operation being performed under circumstances where the band-set value is appropriately adjusted with difficulty, the amplifier 4 may appropriately reduce the occurrence of the inconvenience.

(Example Application for Communication Apparatus)

Figure 7:
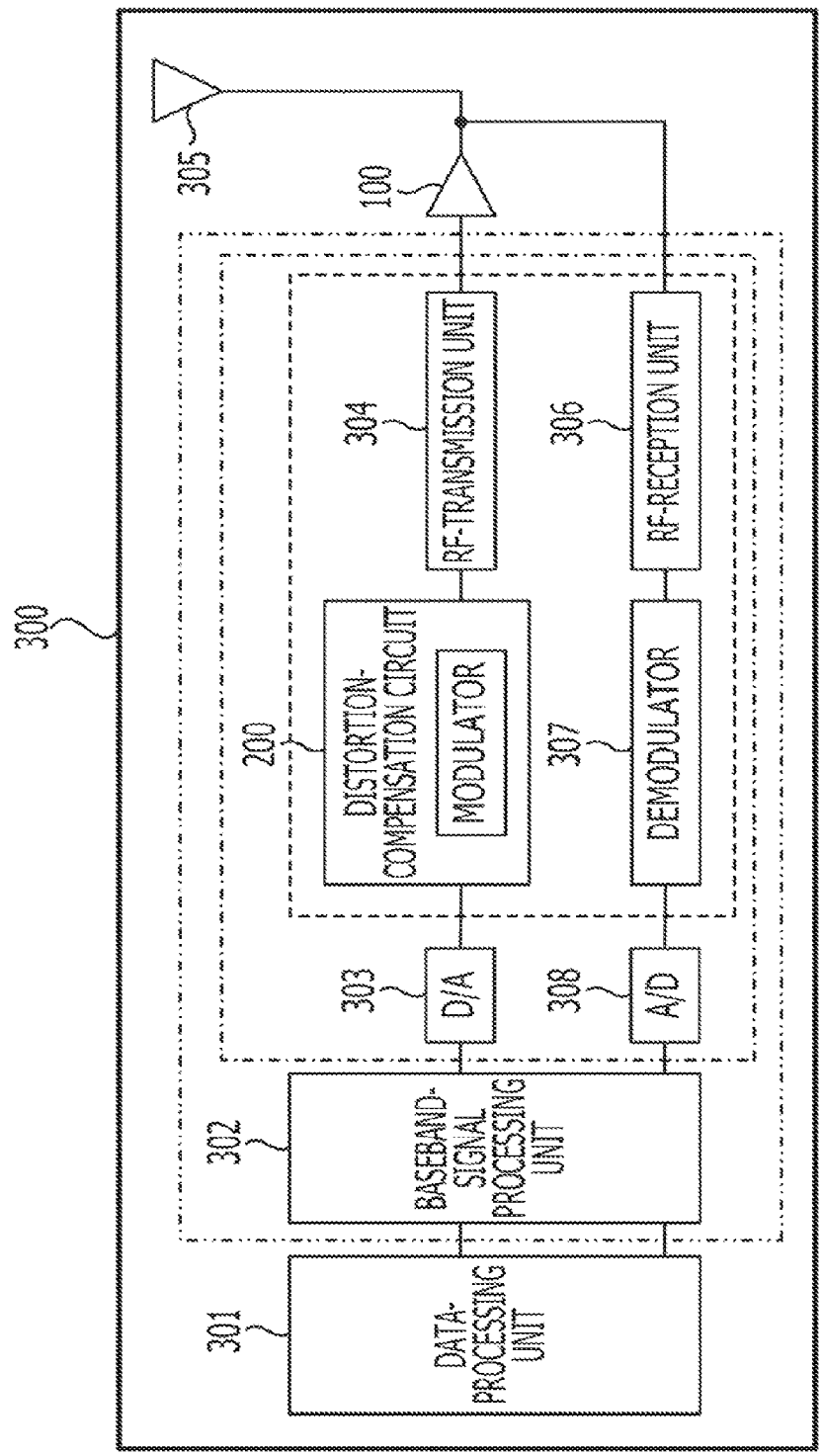
FIG. 7 is a block diagram illustrating an exemplary configuration achieved when the amplifier of the first embodiment is used for a communication apparatus.

An example where the above-described amplifier 1 of the first embodiment is used for a communication apparatus will be described with reference to FIG. 7. Here, FIG. 7 is a block diagram illustrating an exemplary configuration achieved when the above-described amplifier 1 of the first embodiment is used for the communication apparatus. Further, the amplifier 2 of the second embodiment, the amplifier 3 of the third embodiment, and/or the amplifier 4 of the fourth embodiment may be used for the communication apparatus in substantially the same mode as that in which the amplifier 1 of the first embodiment is used for the communication apparatus.

As illustrated in FIG. 7, a communication apparatus 300 includes a data-processing unit 301, a baseband-signal-processing unit 302, a digital-to-analog (D/A) converter 303, the distortion-compensation circuit 200 including a modulator, a radio frequency (RF)-reception unit 304, the power amplifier 100, an antenna 205, an RF-reception unit 306, a demodulator 307, and an analog-to-digital (A/D) converter 308. Here, a communication apparatus used for a radio-communication system including a mobile phone, a radio-base station, and so forth may be an example of the above-described communication apparatus.

In the communication apparatus 300, the following operations are performed at the data-transmission time. First, the data-processing unit 301 performs data processing (e.g., encoding processing, coding processing, error-correction-code-adding processing, and so forth) for data for transmission so that transmission data is generated. After that, the baseband-signal-processing unit 302 performs baseband processing for the transmission data so that a baseband signal is generated. After that, the D/A converter 303 converts the baseband signal which is a digital signal into an analog signal. Then, the distortion-compensation circuit 200 including the modulator performs the modulation processing for the baseband signal converted into the analog signal so that a modulation signal is generated. After that, the RF-transmission unit 304 performs various types of RF processing for the modulation signal so that an RF signal is generated. Then, the power amplifier 100 performs amplifying processing for the RF signal so that a transmission signal is generated. After that, the antenna 305 transmits the transmission signal as a radio wave so that the data transmission is performed.

On the other hand, the following operations are performed at the data-reception time. First, the antenna 305 receives a radio wave including a reception signal. After that, the RF-reception unit 306 performs the various types of RF processing for the reception signal received by the antenna 305 so that a modulation signal is generated. Then, the demodulator 307 performs demodulation processing for the modulation signal so that a baseband signal is generated. After that, the A/D converter 308 converts the baseband signal which is an analog signal to a digital signal. Then, the baseband-signal-processing unit 302 performs the baseband processing for the baseband signal converted into the digital signal so that reception data is generated. After that, the data-processing unit 301 performs data processing (e.g., decoding processing, error-correction processing, and so forth) for the reception data so that the data reception is performed.

Since the above-described distortion-compensation circuit 200 and the power amplifier 100 are used for the data-transmission system, the communication apparatus 300 allows for enjoying substantially the same effects as the various effects that are enjoyed through the above-described amplifier 1. More specifically, even though the communication apparatus 300 is manufactured by individually obtaining a chip including a circuit part surrounded by dotted lines that are illustrated in FIG. 7 and a chip including the power amplifier 100, and combining the chips with each other, for example, the achieved communication apparatus 300 allows for reducing the signal level of each of the above-described unwanted waves 1 and 2 while saving the manufacturer of the communication apparatus 300 from having to manually adjust the band-set value. Otherwise, even though the communication apparatus 300 is manufactured by individually obtaining a chip including a circuit part surrounded by long dashed short dashed lines and/or long dashed double-short dashed lines that are illustrated in FIG. 7 and a chip including the power amplifier 100, and combining the chips with each other, for example, the achieved communication apparatus 300 also allows for reducing the signal level of each of the above-described unwanted waves 1 and 2 while saving the manufacturer of the communication apparatus 300 from having to manually adjust the band-set value.

Accordingly, the embodiments discussed herein provide a signal-compensation device which allows for using an amplifier including a filter for a communication apparatus without having the expertise to design the filter and a communication apparatus including the signal-compensation device.

The above-described signal-compensation device allows for adjusting a band-set value based on the signal level of each of first and second signal components. Additionally, the signal-compensation device allows for adjusting the band-set value, in a sense, automatically and/or autonomously through operations of an adjustment unit. Consequently, the signal level of each of the first and second signal components may be appropriately controlled without having the expertise to adjust the band-set value (that is, the design of a band-limitation unit). In other words, the signal level of each of the first and second signal components may be appropriately controlled without manually adjusting the band-set value. Therefore, the signal level of each of the first and second signal components may be appropriately controlled even though the amplifier (and/or a communication apparatus or the like including the amplifier) is manufactured by individually obtaining a chip including the signal-compensation device and a chip including an amplifier such as a power amplifier, and combining the chips with each other.

The above-described communication apparatus may enjoy the same effects as those enjoyed by the above-described signal-compensation device.

According to the embodiments discussed herein, it is possible to reduce interference between signals to be received by units of terminal equipment regardless of the physical link topology in which the base station and the remote access units are connected to each other.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiments of the present inventions have been described in detail, it should be understood that the various changes, substitutions, and alterations could be made hereto without departing from the spirit and scope of the invention.

What is claimed is:

1. A signal-compensation device comprising:
    a band-limitation unit that performs band limitation on a signal based on a variably adjusted band-set value and externally transmits the signal subjected to the band limitation to an amplifier;
    a measurement unit that measures a signal level of each of first and second signal components of a feedback signal which is part of an output of the amplifier fed back by a feedback unit to the band-limitation unit, where the each of first and second signal components is based on at least one of a property of variability of the band-set value, a feedback of the feedback signal by the feedback unit, and a nonlinear distortion of the amplifier; and
    an adjustment unit that adjusts the band-set value based on the signal level of each of the first and second signal components.

2. The signal-compensation device according to claim 1, wherein
    the measurement unit measures the signal level of the each of the first and second signal components, where the first signal component has a property of decreasing the signal level as a decrease in the band-set value and the second signal component has a property of increasing the signal level as a decrease in the band-set value.

3. The signal-compensation device according to claim 1, wherein
    the measurement unit measures the signal level of the each of first and second signal components, where the first signal component occurs due to feedback of the feedback signal by the feedback unit, and the second signal components occurs due to a nonlinear distortion of the amplifier.

4. The signal-compensation device according to claim 1, wherein
    the adjustment unit adjusts the band-set value so that the signal level of the first signal component becomes smaller than or equal to a first given threshold value and the signal level of the second signal component becomes smaller than or equal to a second given threshold value.

5. The signal-compensation device according to claim 4, further comprising:
    a notification unit that externally notifies that the signal level of the first signal component does not become smaller than or equal to the first threshold value and the signal level of the second signal component does not become smaller than or equal to the second threshold value when it is difficult to adjust the band-set value for the signal level of the first signal component to become smaller than or equal to the first threshold value and the signal level of the second signal component to become smaller than or equal to the second threshold value.

6. The signal-compensation device according to claim 4, further comprising:
    a changing unit that changes an operation voltage of the amplifier when it is difficult to adjust the band-set value for the signal level of the first signal component to become smaller than or equal to the first threshold value and the signal level of the second signal component to become smaller than or equal to the second threshold value.

7. The signal-compensation device according to claim 6, wherein the changing unit changes the operation voltage of the amplifier by increasing the operation voltage.

8. The signal-compensation device according to claim 4, further comprising:
    a controller that controls the feedback unit so that the feedback signal is not fed back to the band-limitation unit when it is difficult to adjust the band-set value for the signal level of the first signal component to become smaller than or equal to the first threshold value and the signal level of the second signal component to become smaller than or equal to the second threshold value.

9. A communication apparatus comprising:
    a signal-compensation device; and
    an amplifier configured to perform amplification processing,
    wherein the signal-compensation device includes:
    a band-limitation unit that performs band limitation on a signal based on a variably adjusted band-set value and externally transmits the signal subjected to the band limitation to the amplifier;
    a measurement unit that measures a signal level of each of first and second signal components of a feedback signal which is part of an output of the amplifier fed back by a feedback unit to the band-limitation unit, where the each of first and second signal components is based on at least one of a property of variability of the band-set value, a feedback of the feedback signal by the feedback unit, and a nonlinear distortion of the amplifier; and
    an adjustment unit that adjusts the band-set value based on the signal level of each of the first and second signal components.

10. The signal-compensation device according to claim 9, wherein
    the measurement unit measures the signal level of the each of the first and second signal components, where the first signal component has a property of decreasing the signal level as a decrease in the band-set value and the second signal component has a property of increasing the signal level as a decrease in the band-set value.

11. The signal-compensation device according to claim 9, wherein
    the measurement unit measures the signal level of the each of first and second signal components, where the first signal component occurs due to feedback of the feedback signal by the feedback unit, and the second signal components occurs due to a nonlinear distortion of the amplifier.

12. The signal-compensation device according to claim 9, wherein
the adjustment unit adjusts the band-set value so that the signal level of the first signal component becomes smaller than or equal to a first given threshold value and the signal level of the second signal component becomes smaller than or equal to a second given threshold value.

13. A signal-compensation method comprising:
performing band limitation on a signal based on a variably adjusted band-set value and externally transmitting the signal subjected to the band limitation to an amplifier;
measuring a signal level of each of first and second signal components of a feedback signal which is part of an output of the amplifier fed back by a feedback unit to the performing band limitation, where the each of first and second signal components is based on at least one of a property of variability of the band-set value, a feedback of the feedback signal by the feedback unit, and a nonlinear distortion of the amplifier; and
adjusting the band-set value based on the signal level of each of the first and second signal components.

14. The signal-compensation method according to claim 13, wherein
the measuring measures the signal level of the each of the first and second signal components, where the first signal component has a property of decreasing the signal level as a decrease in the band-set value and the second signal component has a property of increasing the signal level as a decrease in the band-set value.

15. The signal-compensation method according to claim 13, wherein
the measuring measures the signal level of the each of first and second signal components, where the first signal component occurs due to feedback of the feedback signal by the feedback unit, and the second signal components occurs due to a nonlinear distortion of the amplifier.

16. The signal-compensation method according to claim 13, wherein
the adjusting includes adjusting the band-set value so that the signal level of the first signal component becomes smaller than or equal to a first given threshold value and the signal level of the second signal component becomes smaller than or equal to a second given threshold value.

17. The signal-compensation method according to claim 16, further comprising:
notifying externally that the signal level of the first signal component does not become smaller than or equal to the first threshold value and the signal level of the second signal component does not become smaller than or equal to the second threshold value when it is difficult to adjust the band-set value for the signal level of the first signal component to become smaller than or equal to the first threshold value and the signal level of the second signal component to become smaller than or equal to the second threshold value.

18. The signal-compensation method according to claim 16, further comprising:
changing an operation voltage of the amplifier when it is difficult to adjust the band-set value for the signal level of the first signal component to become smaller than or equal to the first threshold value and the signal level of the second signal component to become smaller than or equal to the second threshold value.

19. The signal-compensation method according to claim 18, wherein
the changing changes the operation voltage of the amplifier by increasing the operation voltage.

20. The signal-compensation method according to claim 16, further comprising:
controlling the feedback unit so that the feedback signal is not fed back to the performing band limitation when it is difficult to adjust the band-set value for the signal level of the first signal component to become smaller than or equal to the first threshold value and the signal level of the second signal component to become smaller than or equal to the second threshold value.

* * * * *